United States Patent
Do et al.

(10) Patent No.: US 7,266,030 B2
(45) Date of Patent: Sep. 4, 2007

(54) METHOD FOR MEASURING OFFSET VOLTAGE OF SENSE AMPLIFIER AND SEMICONDUCTOR EMPLOYING THE METHOD

(75) Inventors: Chang-Ho Do, Ichon-shi (KR); Jin-Seok Son, Ichon-shi (KR)

(73) Assignee: Hynix Semiconductor, Inc. (KR)

( * ) Notice: Subject to any disclaimer, the term of this patent is extended or adjusted under 35 U.S.C. 154(b) by 31 days.

(21) Appl. No.: 11/059,777

(22) Filed: Feb. 16, 2005

(65) Prior Publication Data

US 2006/0092735 A1  May 4, 2006

(30) Foreign Application Priority Data

Oct. 30, 2004  (KR) .................. 10-2004-0087670

(51) Int. Cl.
G11C 7/02  (2006.01)
(52) U.S. Cl. .................. 365/207; 365/145; 365/201
(58) Field of Classification Search ............... 365/207, 365/145, 201, 205, 194, 203, 190
See application file for complete search history.

(56) References Cited

U.S. PATENT DOCUMENTS

| | | | |
|---|---|---|---|
| 5,051,995 A * | 9/1991 | Tobita .................. 714/718 |
| 5,422,839 A | 6/1995 | Ishibashi et al. |
| 5,745,419 A | 4/1998 | Brauch |
| 5,920,517 A | 7/1999 | Wendell |
| 5,923,601 A | 7/1999 | Wendell |
| 5,936,892 A | 8/1999 | Wendell |
| 5,991,189 A * | 11/1999 | Miwa .................. 365/145 |
| 6,205,068 B1 * | 3/2001 | Yoon .................. 365/203 |
| 6,275,961 B1 * | 8/2001 | Roohparvar .............. 714/718 |
| 6,288,950 B1 | 9/2001 | Koike |
| 2005/0002245 A1 | 1/2005 | Brede et al. |
| 2006/0050572 A1 * | 3/2006 | Gouin et al. .............. 365/194 |

FOREIGN PATENT DOCUMENTS

| | | |
|---|---|---|
| JP | 11-149796 | 6/1999 |
| JP | 2002-279798 | 9/2002 |
| KR | 2002-0046905 | 6/2002 |
| KR | 2003-0002272 | 1/2003 |

* cited by examiner

Primary Examiner—Richard T. Elms
Assistant Examiner—Dang Nguyen
(74) Attorney, Agent, or Firm—Townsend and Townsend and Crew LLP

(57) ABSTRACT

A semiconductor memory device precisely measures the offset voltage of a bit line sense amplifier. The semiconductor memory device of the invention includes: a bit line sense amplifier for amplifying a voltage difference between a bit line and an inversion bit line, which carry data written on a memory cell when the data is read; a data input/output line and an inversion data input/output line within a core region coupled to the bit line and the inversion bit line via one or more switches; a first external voltage supply pad connected to the data input/output line; a second external voltage supply pad connected to the inversion data input/output line; and an external voltage supply controller for switching a connection of the data input/output line and the first external voltage supply pad and a connection of the inversion data input/output line and the second external voltage supply pad.

28 Claims, 16 Drawing Sheets

FIG. 2A
(PRIOR ART)
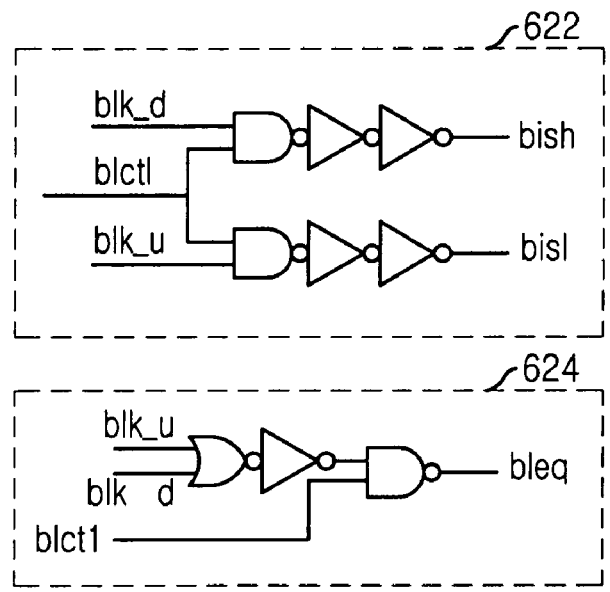
FIG. 2B
(PRIOR ART)
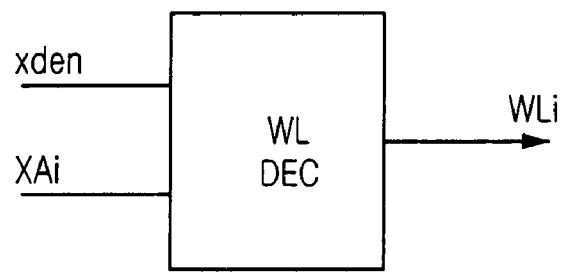
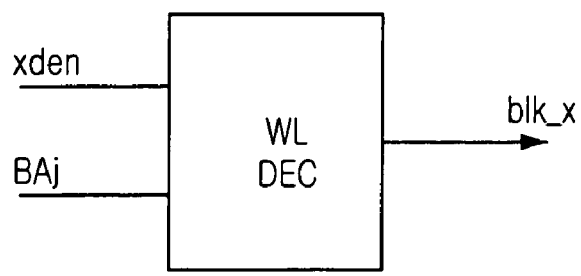

FIG. 7
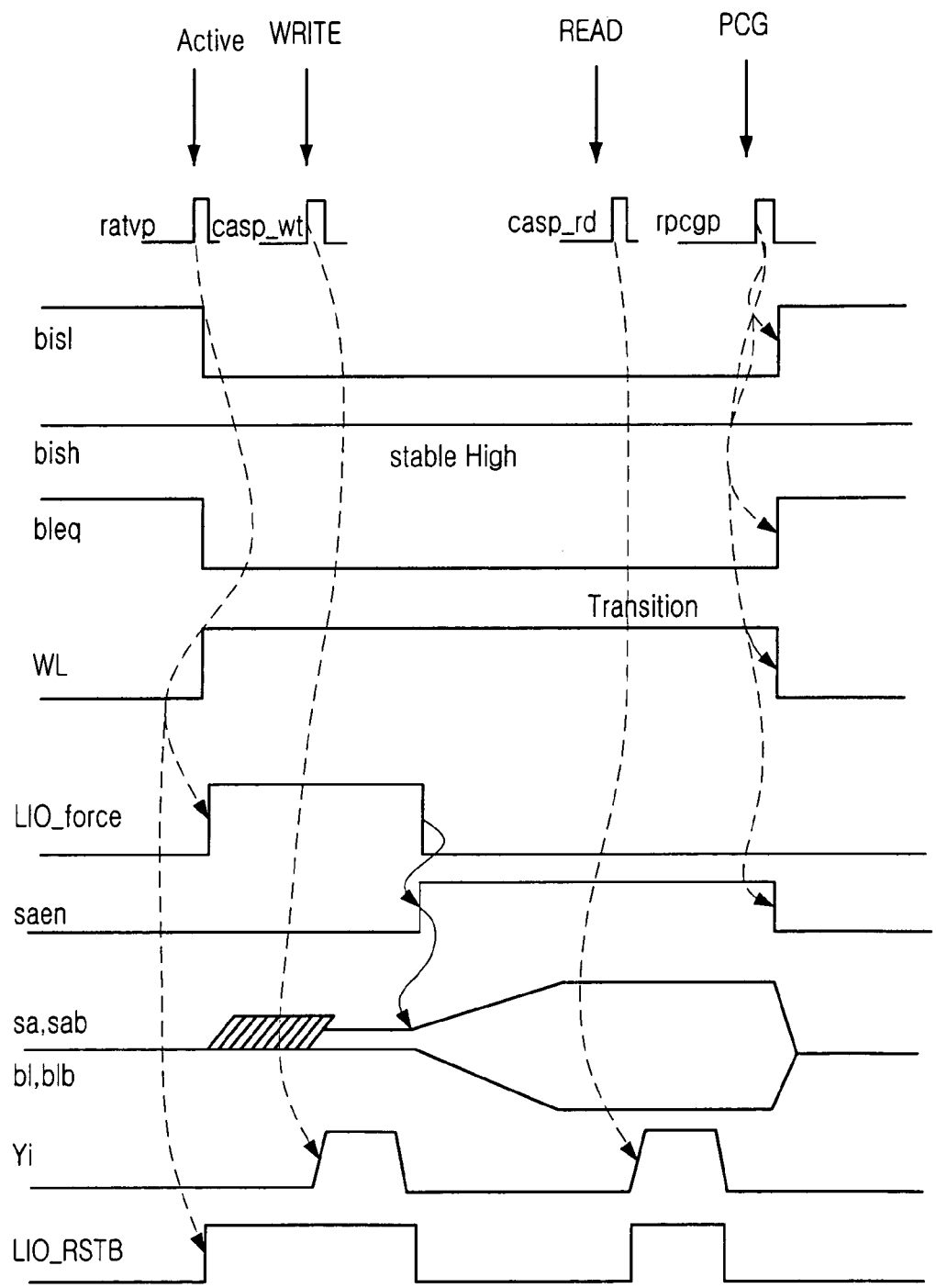

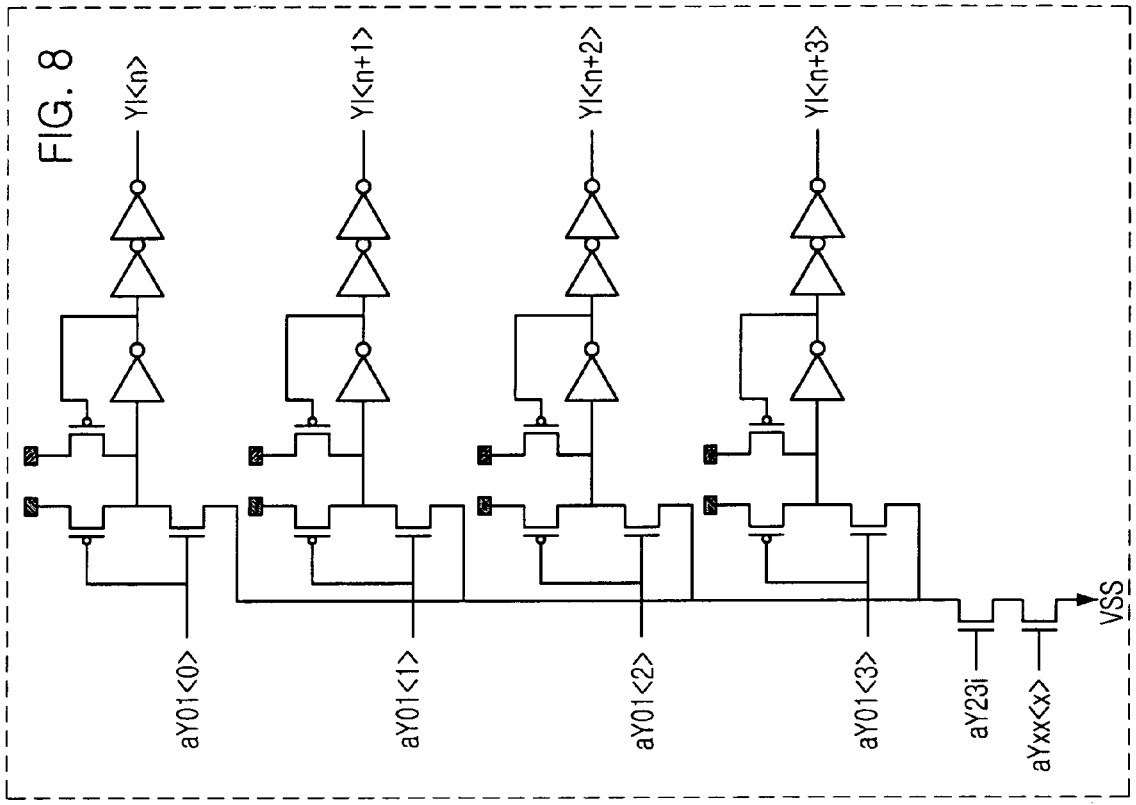
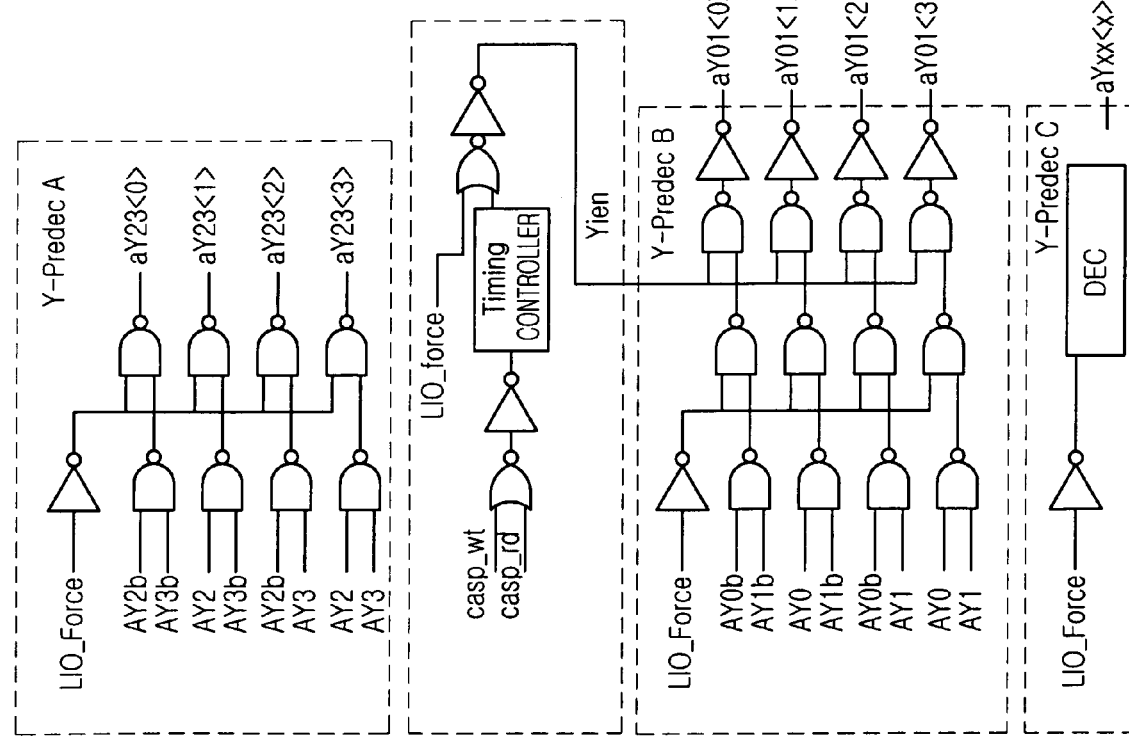
FIG. 8

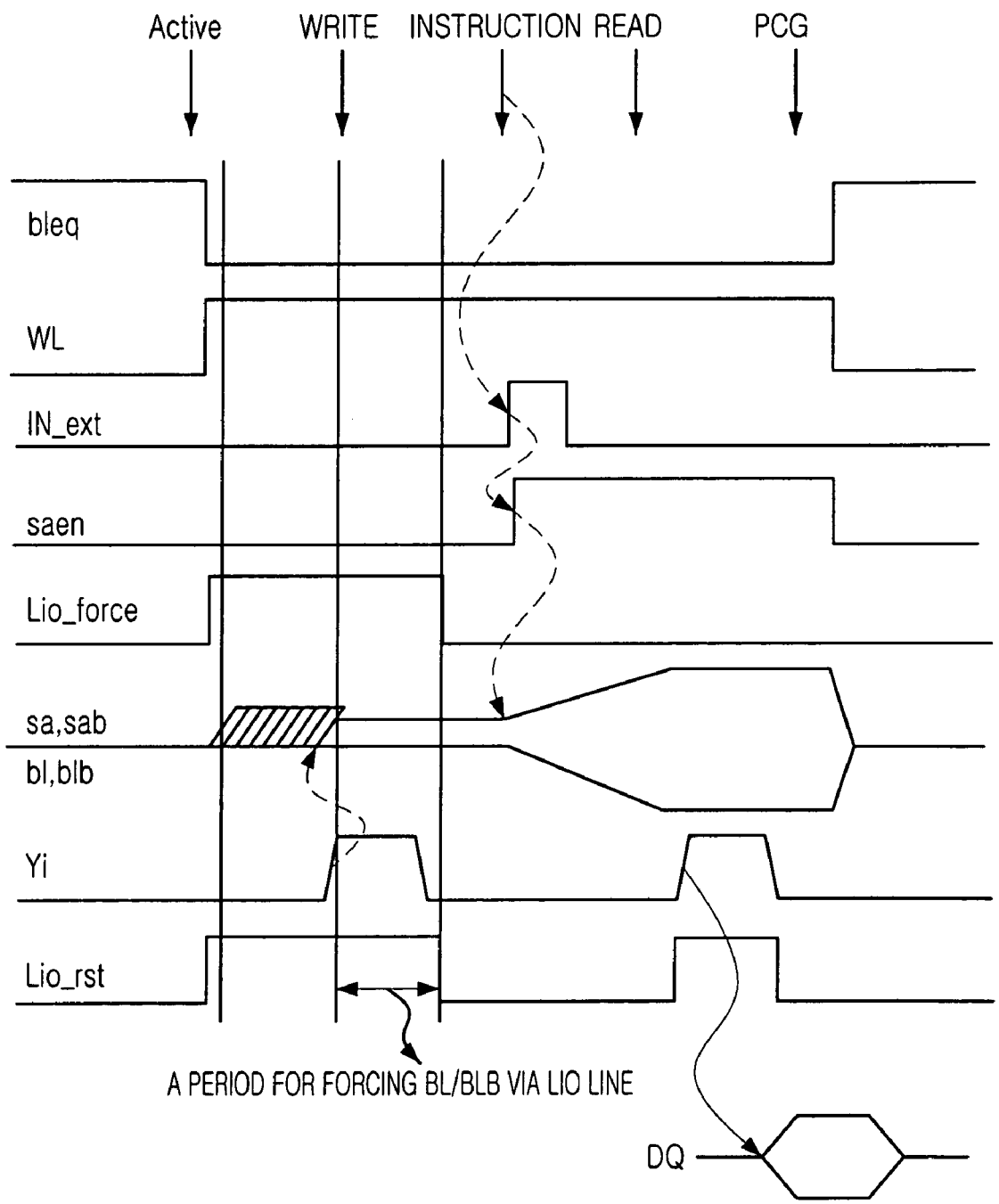

METHOD FOR MEASURING OFFSET VOLTAGE OF SENSE AMPLIFIER AND SEMICONDUCTOR EMPLOYING THE METHOD

CROSS-REFERENCES TO RELATED APPLICATIONS

This application claims priority to Korean Patent Application No. 10-2004-0087670, filed Oct. 30, 2004, of Chang-Ho Do et al., titled "Semiconductor Memory Device and Bit Line Sense Amplifier Offset Voltage Measuring Method of It," which is incorporated by reference herein in its entirety for all purposes.

BACKGROUND OF THE INVENTION

The present invention relates to semiconductor memory devices; and, more particularly, to semiconductor memory devices that measure the offset voltage of sense amplifiers.

In a semiconductor memory device such as a dynamic random access memory (DRAM), a bit line sense amplifier (hereinafter, "amp") is used to amplify a low voltage level of data stored in each memory cell so that the data can be read outside the memory device.

FIG. 1 shows a data read path and a data write path in a core region of a conventional semiconductor memory device.

As shown, the memory device includes a cell array 510, a bit line sense amp block 520, a bit line sense amp (BLSA) controller 620, a word line driver 610, an IO sense amp 594, a write driver 592, a local I/O line precharger 570, and a Y decoder 630.

The semiconductor memory device further includes a bit line controller 650 for BLSA controller 620, a local precharger controller 530 for local I/O line precharger 570, a write driver controller 580 for write driver 592, and a Y decoder controller 640 for Y decoder 630.

In the conventional memory device, during a write operation, data from an input/output pad DQ is delivered to write driver 592 through a global input/output line GIO via an I/O driver 598. During a read operation, data stored in the cell array is forwarded to I/O driver 598 along global input/output line GIO through an IO sense amp 594 and then outputted through input/output pad DQ.

Write driver 592 and I/O sense amp 594 are coupled to bit line sense amp block 520 through local input/output lines LIO and LIOB, wherein a control signal Yi controls the connection. Y decoder 630 issues the control signal based on an inputted column address. Further, local I/O line precharger 570 precharges the local input/output lines LIO and LIOB.

Details of data processes from cell array to the bit line sense amp block in the semiconductor memory device, i.e., details of data processes in the semiconductor memory devices, such as sensing, amplifying, inputting, etc. are omitted herein because they are obvious to those skilled in the art.

Several specific circuits constitute BLSA controller 620, which activates sense amp 522; for example, where FIG. 2A shows a bit line selector 622, FIG. 2B depicts a bit line precharger controller 624, and FIG. 2C shows a sense amp driver 626.

In outputs from bit line sense amp 522, offset voltages may occur for various reasons, for example, a threshold voltage difference of MOS transistor devices, a difference in transconductance, a capacitance difference between a bit line and an inversion bit line, etc. Since voltage variation of the bit line is not large when data stored in cell array 510 is loaded, stable read operations in the semiconductor memory device are difficult to guarantee if the offset voltage of sense amp 522 is large. Thus, in order to secure a stable read operation in the semiconductor memory device, the offset voltage of the sense amp should be measured.

To measure the offset voltage of the sense amp according to prior art, a variation of the bias voltage of an electrode positioned opposite a cell storage node is specified. Then, the sense amp senses a data outputted from the cell array according to the variation of the bias voltage and, as a result, determines whether the data is erroneous, thereby computing offset voltage by applying a theoretical formula thereto.

In the conventional method, however, it is troublesome to precisely measure the capacitance of a unit cell in the cell array and the capacitance of the bit line coupled to the unit cell. Calculation of the pure offset voltage of the bit line sense amp has been difficult and until now, this voltage has been approximately calculated rather than actually measured. Stable operation of a semiconductor memory device cannot be guaranteed unless the offset voltage is correct.

BRIEF SUMMARY OF THE INVENTION

The invention provides a semiconductor memory device that computes the offset voltage of a bit line sense amp, by supplying a controllable test voltage to a bit line sense amp.

One exemplary embodiment of the invention includes a semiconductor memory device that measures the offset voltage of a sense amplifier, which contains a bit line sense amplifier for amplifying the voltage difference between a bit line and an inversion bit line, for conveying data stored in a memory cell in response to an inputted command and address; a data input/output line and an inversion data input/output line within a core region, coupled to the bit line and the inversion bit line via one or more switches; and an external voltage supply controller that transmits test voltages to the data input/output line and the inversion data input/output line in response to a test control signal.

Another aspect of the invention is a method of measuring the offset voltage of a sense amplifier. The method includes applying a test voltage from an externally connected contact pad to a data input/output line in a core region; generating an equalization signal for the inactivated data input/output line; cutting off all memory cells coupled to the sense amp line to be tested; ceasing application of the test voltage; activating the sense amp; and reading data amplified by the sense amp using a read path of the memory device.

A further understanding of the nature and advantages of the present invention may be realized by reference to the remaining portions of the specification and the drawings.

BRIEF DESCRIPTION OF THE DRAWINGS

The above and other objects and features of the invention are apparent when the following description of exemplary embodiments is read in conjunction with the accompanying drawings, in which:

FIG. 2A is a schematic circuit diagram representing the bit line selection controller included in a BLSA controller shown in FIG. 1;

FIG. 2B is a schematic circuit diagram of a bit line precharger controller contained in the BLSA controller shown in FIG. 1;

FIG. 7 is a timing diagram representing an operation of the sense amp in the semiconductor memory device shown in FIG. 3;

FIG. 8 is a logical circuit diagram of an exemplary embodiment of the Y decoder interruption circuit constituting the semiconductor memory device of the present invention;

FIG. 13 is a timing diagram of an operation performed when testing the offset voltage of the sense amp in a zero test mode of the exemplary semiconductor memory device in accordance with the second illustrative embodiment of the present invention;

DETAILED DESCRIPTION OF THE INVENTION

Hereinafter, an exemplary semiconductor memory device according to the invention is described in detail with reference to the accompanying drawings.

Figure 1:
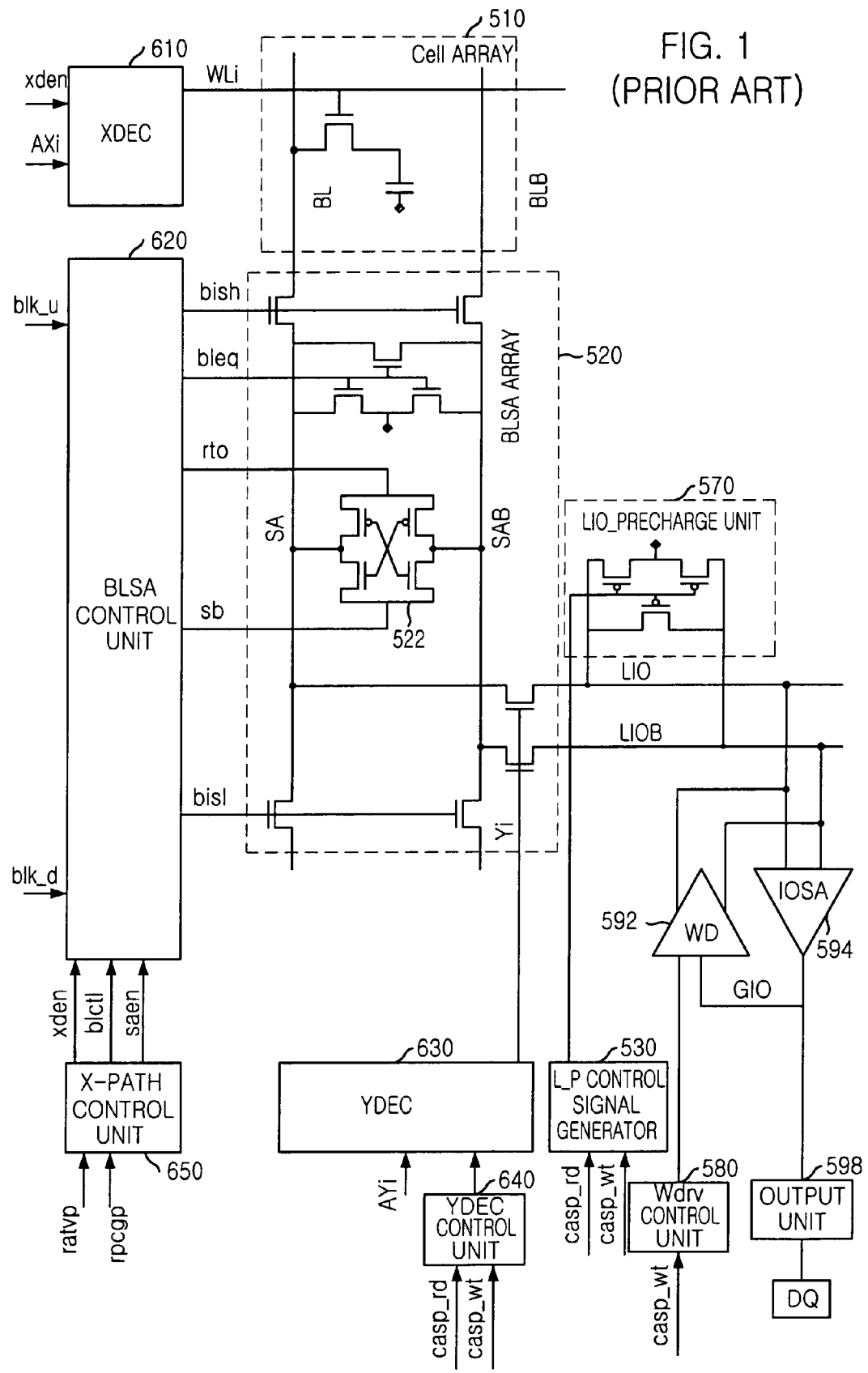
FIG. 1 is a block diagram of data input/output paths in a conventional semiconductor memory device.
Figure 2C:
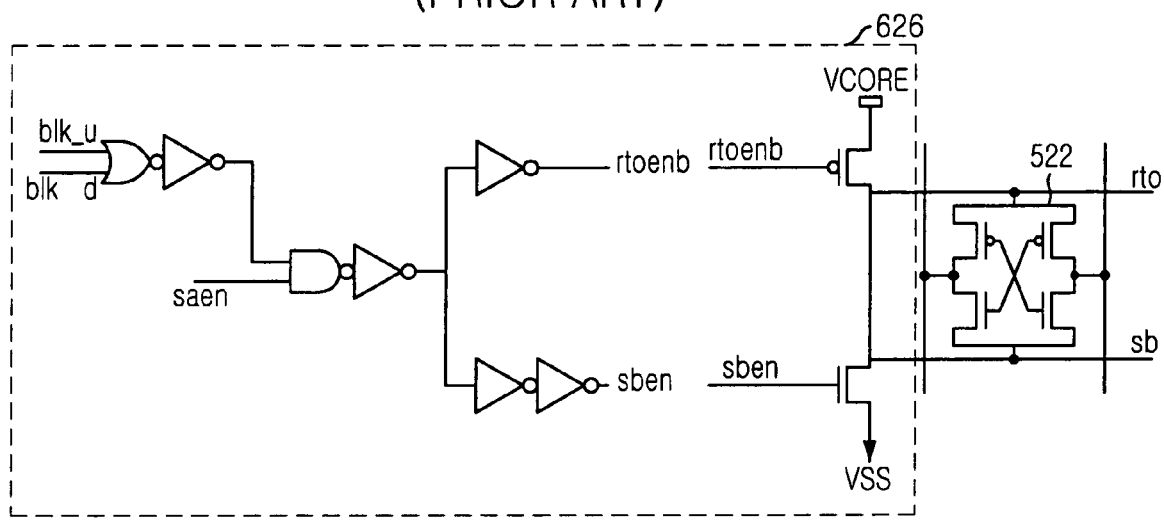
FIG. 2C is a schematic circuit diagram of a sense amp driver embedded in the BLSA controller shown in FIG. 1.
Figure 3:
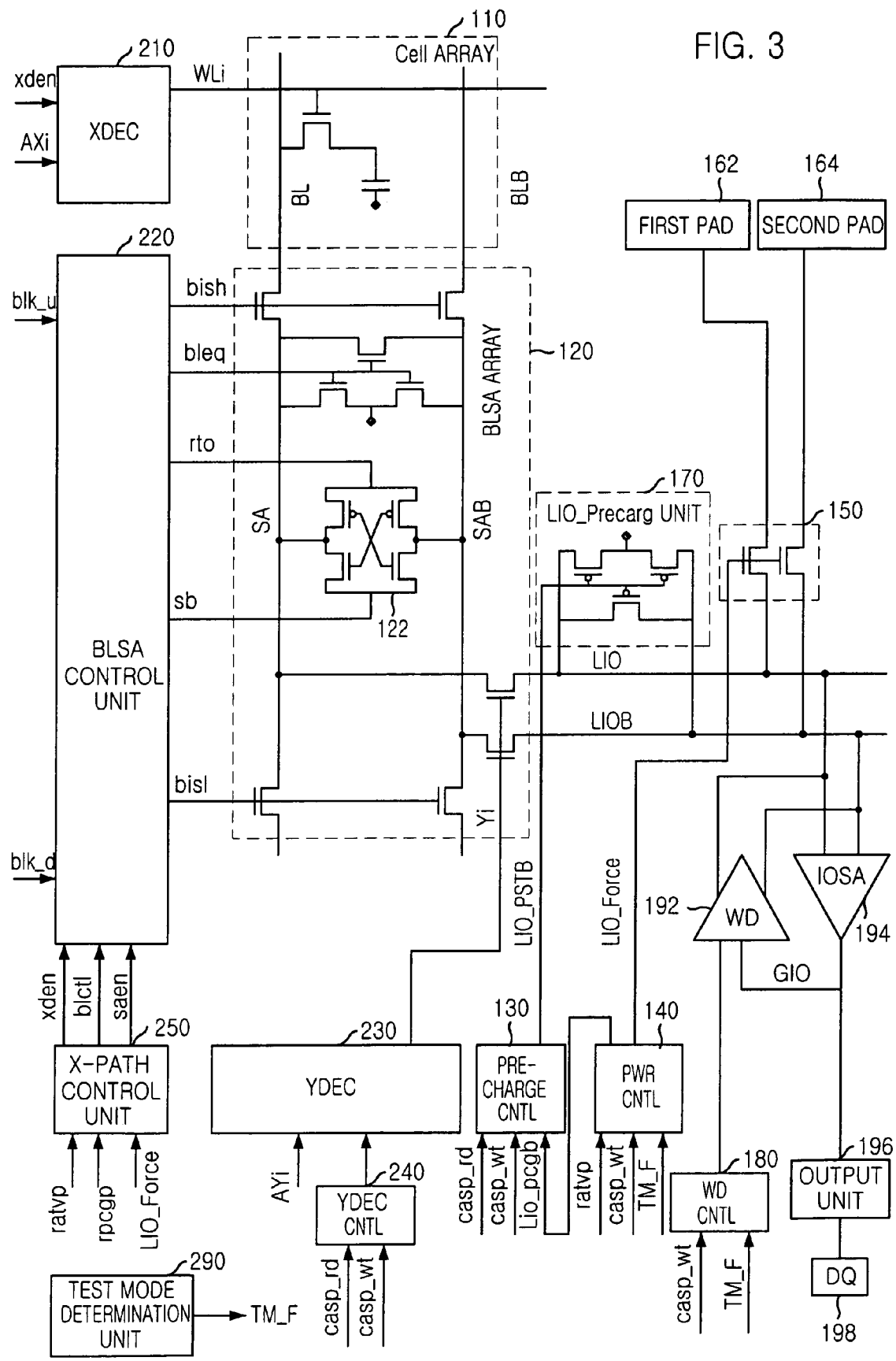
FIG. 3 is a block diagram of representative data input/output paths in a semiconductor memory device in accordance with an exemplary embodiment of the present invention.

FIG. 3 is a block diagram showing the configuration of data input/output paths in a semiconductor memory device in accordance with an exemplary embodiment of the present invention.

As shown, the semiconductor memory device includes a bit line sense amp block 120 having a bit line sense amp 122 for amplifying the voltage difference between a bit line BL and an inversion bit line BLB which convey data written in a memory cell array 110 upon reading the data; a local input/output line LIO and an inversion local input/output line LIOB within a core region that are coupled to the bit line and the inversion bit line by one or more switches; a first external voltage supply pad 162 connected to local input/output line LIO; a second external voltage supply pad 164 connected to the inversion local input/output line LIOB; and an external voltage supply controller 150 for switching a connection of the local input/output line LIO and the first external voltage supply pad and a connection of inversion local input/output line LIOB and the second external voltage supply pad. An external voltage supply instruction generator 140 provides external voltage supply instruction LIO_force that controls external voltage supply controller 150.

In a conventional DRAM device, regions of all cells on which data is stored are divided into array blocks of pluralities of cells, where each cell array block comprises multiple cell arrays, and arrays of bit line sense amps, which lie between the cell arrays. One cell array consists of multiple cell columns; one cell column consists of memory cells having a pair of bit lines; and one bit line sense amp array consists of multiple bit line sense amps.

A configuration where one bit line sense amp array is in charge of upper and lower cell arrays is called a shared sense amp structure. One bit line sense amp in the shared structure, coupled by an upper bit line selection switch to a pair of upper bit lines of cell columns that belong to an upper cell array is also coupled by a lower bit line selection switch to a pair of lower bit lines of cell columns that belong to a lower cell array.

The semiconductor memory device, according to an embodiment of the present invention, further comprises an X decoder 210 for activating a word line selected according to an address X; a bit line sense amp (BLSA) controller 220 for controlling a precharge of bit line BL and inversion bit line BLB, a drive of the bit line sense amp, etc.; an X path controller 250 for adjusting the timing of a control operation of bit line sense amp controller 220; a Y decoder 230 for controlling a Yi switch connecting a bit line to a local input/output line; a Y decoder controller 240 for controlling a drive of Y decoder 230; and a test mode decider 290 for providing test conducting instruction TM_F.

The semiconductor memory device also includes a local line precharge block 170 that precharges local input/output lines, LIO, LIOB, and a local line precharge controller 130 that produces a local line precharge instruction LIO_PSTB to control local line precharge block 170.

In the exemplary semiconductor memory device according to the invention, during the write process, data from an input/output pad (DQ) 198 is delivered to a write driver 192 through a global input/output line GIO via an I/O driver 196; and, during the read process, data stored in a memory cell is transferred to the I/O driver 196 along global input/output line GIO through an IO sense amp 194, and then outputted through input/output pad (DQ) 198. Write driver controller 180 controls write driver 192.

Figure 4A:
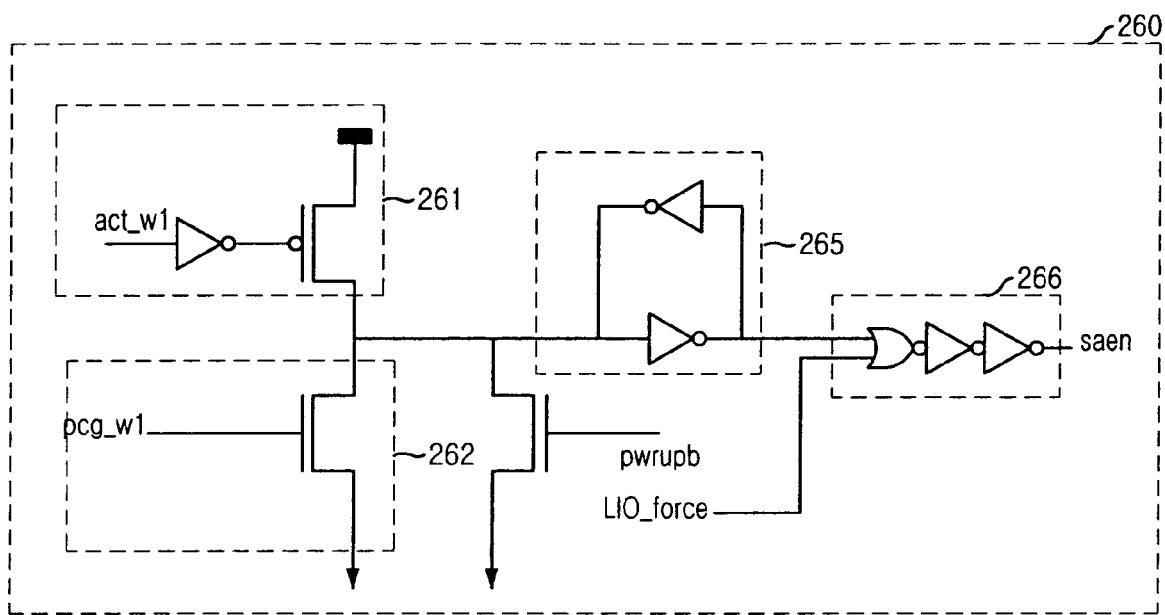
FIG. 4A is a schematic circuit diagram of a sense amp interrupter in the X path controller shown in FIG. 3.

FIGS. 4Aa–4D depict components of X path controller 250 shown in FIG. 3. Specifically, X path controller 250 includes a sense amp interrupter 260 (which is shown in schematic circuit diagram FIG. 4A); a timing controller 270 (which is shown in the block diagram of FIG. 4B); an X decoder interrupter 280 (which is shown in the schematic diagram of FIG. 4c); and a block control signal generator 290 (which is shown in the schematic diagram of FIG. 4D). Sense amp interrupter 260 includes an enable trigger 261 to activate a sense amp enable signal seen with a sense amp active signal act_sa; a disable trigger 262 to inactivate sense amp enable signal seen with a sense amp precharge signal pcg_sa; a latch 265 to provide a toggled state; and an output controller 266 for controlling an output of sense amp enable signal seen according to external voltage supply instruction LIO_force. Output controller 266 contains a NOR gate and an inverter for inputting an output from latch 265 and the external voltage supply instruction LIO_force if external voltage supply instruction LIO force is activated by a logic high state "H", output controller 266 always inactivates sense amp enable signal seen by a logic low state "L".

Timing controller 270 (FIG. 4B), in response to a low active pulse rate, outputs a bit line active signal act_bl, a word line active signal act_wl, and a sense amp active signal act-sa, and, in response to a low precharge pulse, outputs a bit line precharge signal pcg_bl, a word line precharge signal pcg_wl, and a sense amp precharge signal pcg_sa. Sense amp interrupter 260 generates sense amp enable signal seen in response to the sense amp active signal act_sa and the sense amp precharge signal pcg_sa.

Figure 5:
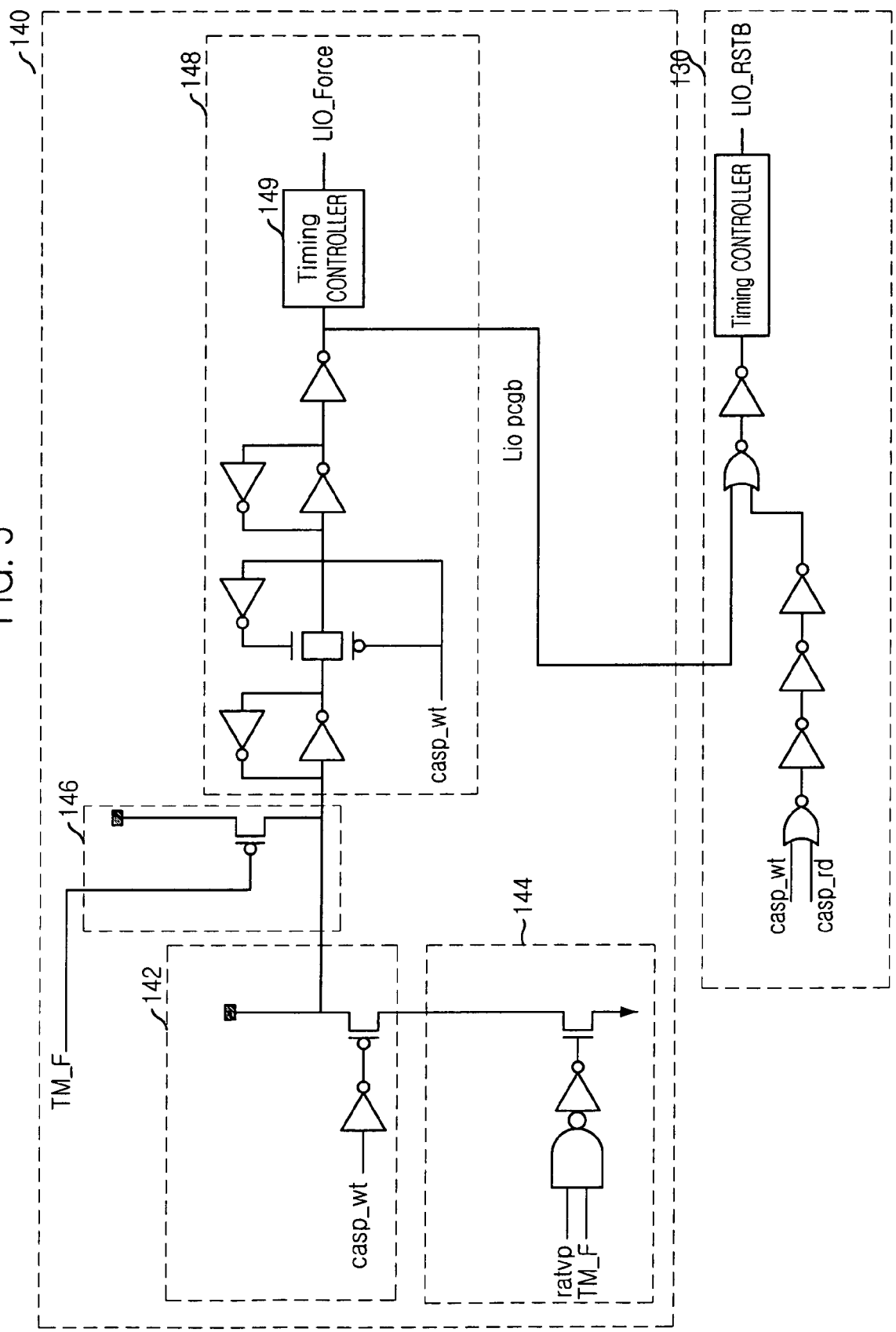
FIG. 5 is a block diagram showing an external voltage supply instruction generator and a local line precharger controller shown in FIG. 3.

FIG. 5 is a block diagram of an external voltage supply instruction generator and a local line precharger controller shown in FIG. 3. External voltage supply instruction generator 140 preferably includes an enable trigger 144 to activate external voltage supply instruction LIO_force by a logic high state "H" on issuance of a low active pulse during the test operation; a disable trigger 142 to inactivate external voltage supply instruction LIO_force by a logic low state "L" on issuance of a write cas pulse; and a latch/delay circuit 148 to adjust the output timing of external voltage supply instruction LIO_force. In addition, latch/delay circuit 148 preferably includes a falling edge delay 149 that uses disable trigger 142 to delay a falling edge of external voltage supply instruction LIO_force.

Local line precharge controller 130 inactivates a local line precharge signal LIO_RSTB by a logic high state "H" for a certain time, in response to a write cas pulse casp_wt or read cas pulse casp_rd command, as in a general case, wherein the external voltage supply instruction LIO_force for any activated interval is also inactivated by a logic high state "H". Local line precharge signal LIO_RSTB maintains the pair of local input/output lines in a precharged state, i.e., they are precharged with a certain voltage during a period other than an interval during which data travels on the input/output lines for read, write, test, and other operations.

Figure 6:
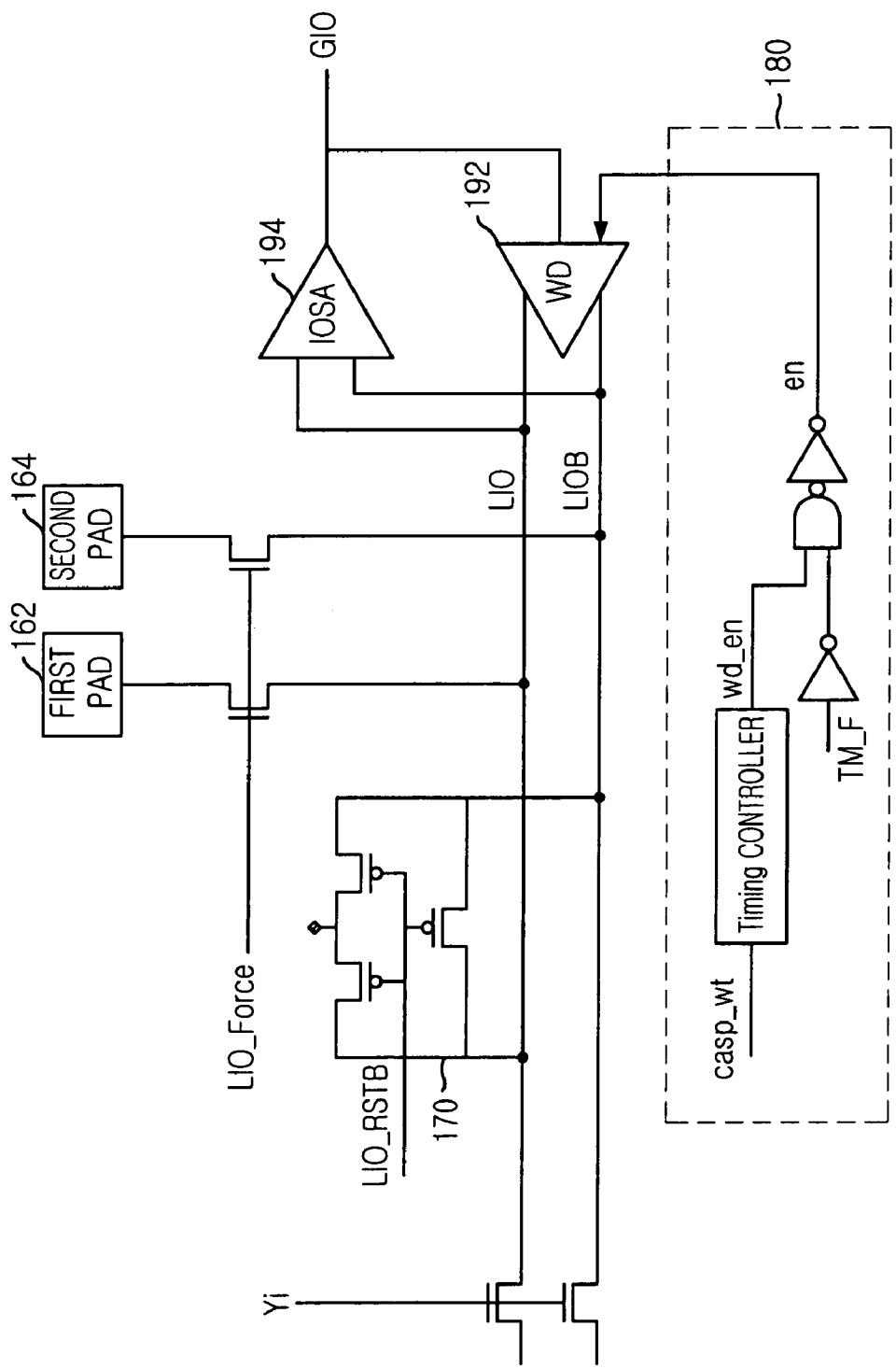
FIG. 6 is a block diagram of a write interrupter shown in FIG. 3 and the exemplary configuration surrounding it.

FIG. 6 is a block diagram showing the write interrupter of the exemplary semiconductor memory device shown in FIG. 3 and the configuration of components surrounding it. Write driver controller 180 generates a write driver enable signal activated during the period required for a write operation in response to an input of write cas pulse casp_wt command. Generally, the write driver enable signal en is always inactivated by a logic low state "L", if the test conducting instruction TM_F is a logic high state "H", as in FIG. 6. That is, when the test conducting instruction TM_F signifies "H" in a sense amp offset voltage test of the invention, controller 180 inactivates write driver 192.

FIG. 7 is a timing diagram representing an operation of the sense amp in the exemplary semiconductor memory device shown in FIG. 3. An operation of the first illustrative embodiment is described in detail below with reference to FIG. 7.

According to one exemplary semiconductor memory device embodiment of the present invention, when the offset voltage is tested, test conducting instruction TM_F (which was activated in the test mode decider) is outputted. Based on the above instruction, a drive in the test mode has been generated by X path interrupter 250, external voltage apply instruction generator 140, and write driver controller 180, which are driven or stopped in response to test conducting instruction TM_F. Even in test mode, multiple operations are carried out in accordance with the external active instruction, for instance, external control signals, as in general operation. On issuance of an active instruction, if a low pulse is generated by a command decoder (not shown), then the external voltage supply instruction is activated by a logic high state "H", bit line equalization signal bleq is activated by a logic high state "H", and the word line signal WLi is properly given such that a memory cell to be tested is selected based on an address X (referred to as step S120). In the shared sense amp structure, a bit line selection signal bish/bisl is sent so that one of two bit line equalization switches is selected (step S120).

Due to the external test voltage applied through first and second external voltage supply pads 162 and 164 according to external voltage supply instruction LIO_force, a voltage difference of the same size as the external voltage is fed to the bit line and the inversion bit line, which were equalized with precharge voltage after performing step S120.

For testing the offset voltage according to this aspect of the invention, a predetermined test voltage is input to a memory cell. That is, via a write operation in response to the predetermined test voltage, data having a predetermined level is energized. Then, by checking the predetermined level of the data stored in the unit cell, the offset voltage can be measured.

When writing the test voltage to the memory cell, multiple write instructions related to a normal write operation are used in the exemplary semiconductor memory device; then, the command decoder generates a write cas pulse casp_wd, which is one of the write instructions. After receiving the write cas pulse casp_wd instruction, disable trigger 142 (FIG. 5) activates external voltage supply instruction LIO_force by applying a certain delay time thereto.

The signal Yi, which is address Y for selecting the sense amp and pair of bit lines that are coupled to the pair of local input/output lines carrying the test voltage, may be activated during a period corresponding to the activation period of external voltage supply instruction LIO_force. Alternatively, the signal may be activated during a certain delay time corresponding to the write cas pulse casp_wd instruction. Otherwise, when a test is run, Yi may be implemented by specifying address Y to the sense amp to be tested. Yi also may be implemented by applying the test voltage to all sense amps coupled to the pair of local input/output lines for testing.

FIG. 8 is the logical circuit diagram showing an exemplary embodiment of the Y decoder interruption circuit of the illustrative semiconductor memory device of the invention.

If the test voltage is fully applied to the memory cell to be tested, the application of test voltage stops and the sense amp is activated, thereby reading detected data. This process inactivates external voltage supply instruction LIO_force with a logic low state "L", stopping the supply of external voltage to the pair of local input/output lines (referred to as step S140). If the external voltage supply instruction LIO_force transfers to a logic low state "L", sense amp interrupter 260 of FIG. 4A activates sense amp enable signal seen with a logic high state "H", thereby activating the sense amp (referred to as step S160). Then, an amplified value is read by the sense amp (referred to as step S180), where a process of reading data using a read path is applied in the exemplary memory device of this embodiment. Accordingly, the command decoder outputs a read cas pulse casp_rd, as in a general read process, even when the reading value is detected in the test mode. If the read cas pulse casp_rd instruction is issued, signal Yi is activated and its corresponding switch is turned-on, in order to choose the sense amp coupled to the pair of local input/output lines. When applying the test voltage, several sense amps (bit lines) are connected to one pair of local input/output lines, but when reading a value detected by a test, only one sense amp (bit line) is connected to one pair of local input/output lines.

In the read operation of step S180, a digital value on the bit line that has been amplified by the sense amp is connected to the local input/output line by turning on switch Yi. Then the value is amplified by an IO sense amp and output to the external input/output pin via the GIO line. If the test voltage difference applied from the outside is larger than the offset voltage of the sense amp, the digital value of the applied test voltage is read out. Conversely, if the test voltage difference applied from the outside is less than the offset voltage of the sense amp, then the sense amp fails to conduct the read operation by proceeding to a precharge (reset) state. The offset voltage measured according to the present invention is generated in response to the memory cell selected by word line signal WLi, the bit line and the sense amp.

When the read operation in step S180 is completed, sense amp enable signal seen, word line signal WLi, etc., are inactivated by the low precharge pulse outputted by the command decoder, which establishes the current time as the precharge time. Then, a bit line pair or a local input/output line pair is precharged and the upper and lower bit line selection switches are turned on.

Figure 9:
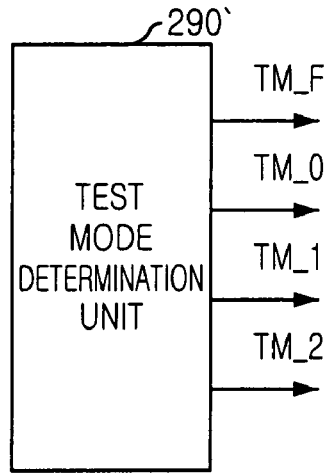
FIG. 9 is a block diagram of an exemplary test mode setting circuit constituting a semiconductor memory device in accordance with a another exemplary embodiment of the present invention.

FIG. 9 is a block diagram showing a test mode setting circuit of a semiconductor memory device in accordance with another exemplary embodiment of the invention.

The semiconductor memory device according to this embodiment can perform a test for measuring offset voltage based on multiple instructions for determining a test mode.

In this case, the test operation of the semiconductor memory device is almost identical to that of the semiconductor memory device described above in FIGS. 3 to 8, except that test mode decider 290' supports six combinations of offset voltage test modes and different component configurations are used when applying each test mode.

Specifically, test mode decider 290', according to the exemplary embodiment currently described, is configured to output a single test conducting instruction TM_F and three test mode signals. A zero instruction TM_0 is a signal activated in a zero test mode; a first instruction TM_1 is a signal activated in a first test mode; and a second instruction TM_2 is a signal activated in a second test mode.

In the zero test mode, the test voltage is applied to a memory cell selected by the Yi switch and X decoder, and a read operation is conducted in response to an external instruction. In the first test mode, a single bit line is coupled to the sense amp to be tested, and test voltage is applied thereto at a state where all memory cells are disconnected for a read operation. In the second test mode, at the state where the bit line is disconnected, test voltage is applied to the sense amp and a read operation is conducted.

The single test conducting instruction TM_F is commonly activated in any of the test modes, and the first instruction TM_1 has no meaning when the second instruction TM_2 is activated. Thus, six combination test modes are obtained as follows: "TM_0=on, TM_1=off, TM_2=off", "TM_0=on, TM_1=on, TM_2=off", "TM_0=on, TM_2=on", "TM_0=off, TM_1=off, TM_2=off", "TM_0=off, TM_1=on, TM_2=off", "TM_0=off, TM_2=on".

In the first and the second test modes, since there is no means for storing the applied test voltage, it is desirable to amplify the applied test voltage directly, after the sense amp enable signal is activated as soon as the external voltage supply instruction is inactivated. When the sense amp commences an amplification operation, the amplified digital value is latched for as long as the sense amp is turned on. Accordingly, the first and/or second test modes may be designed such that, after the test voltage is applied to all of sense amps that are coupled to one pair of input/output lines in a group, the test is conducted by reading each sense amp in sequence.

Figure 10:
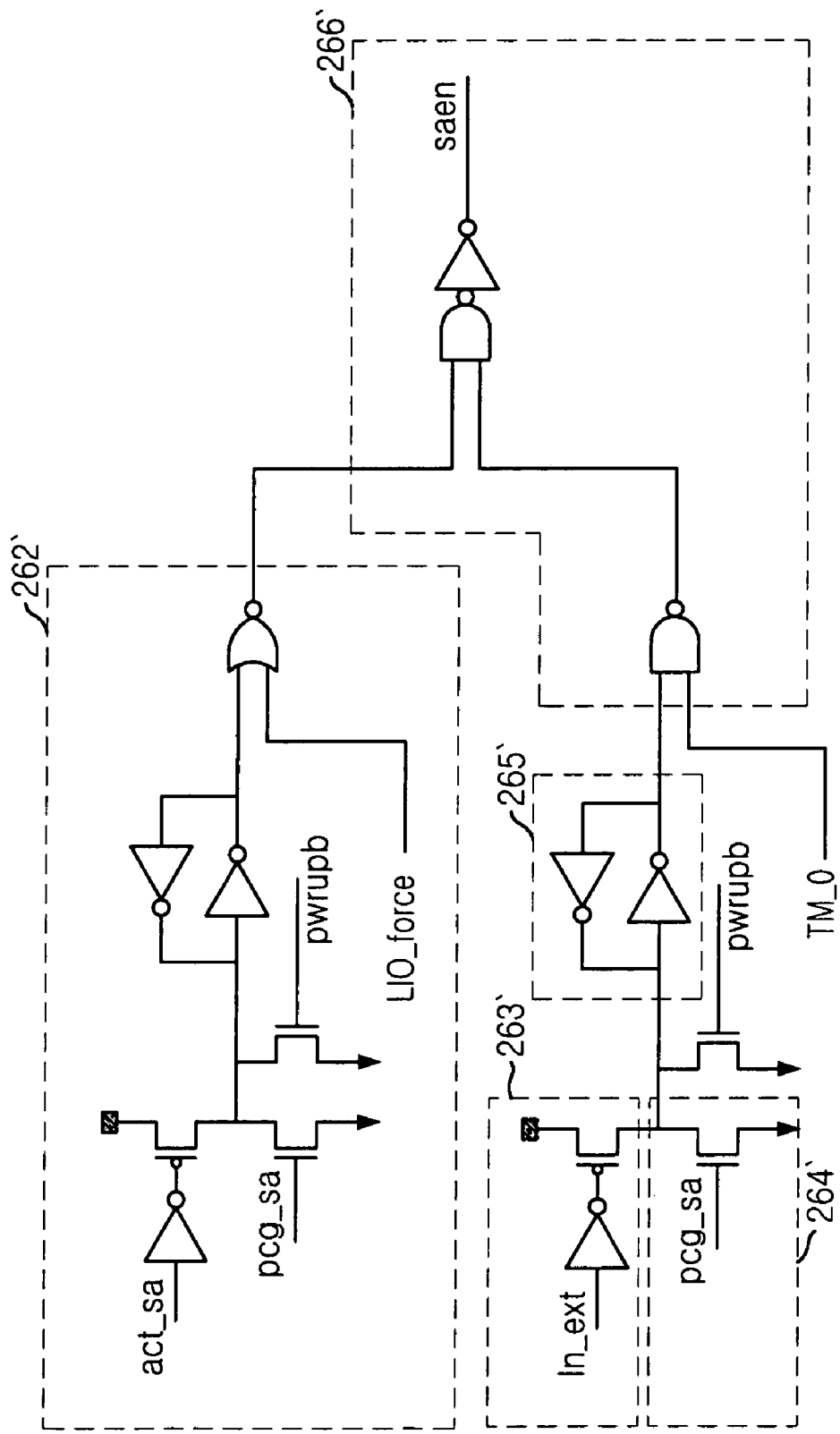
FIG. 10 is a schematic circuit diagram of a sense amp interrupter included in the X path controller of the exemplary semiconductor memory device.

FIG. 10 is a schematic circuit diagram showing a sense amp interrupter in the X path controller of the exemplary semiconductor memory device. Sense amp interrupter 260' comprises an internal interrupter 262' having a structure similar to sense amp interrupter 260 shown in FIG. 3A, an enable trigger 263' for activating sense amp enable signal seen according to an external signal In_ext, a disable trigger 264' for inactivating sense amp enable signal seen according to sense amp precharge signal pcg_sa, a latch 265' for to toggle the result of enable trigger 263' and disable trigger 264', and an output controller 266' for interrupting an output of sense amp enable signal seen from latch 265".

Figure 4B:
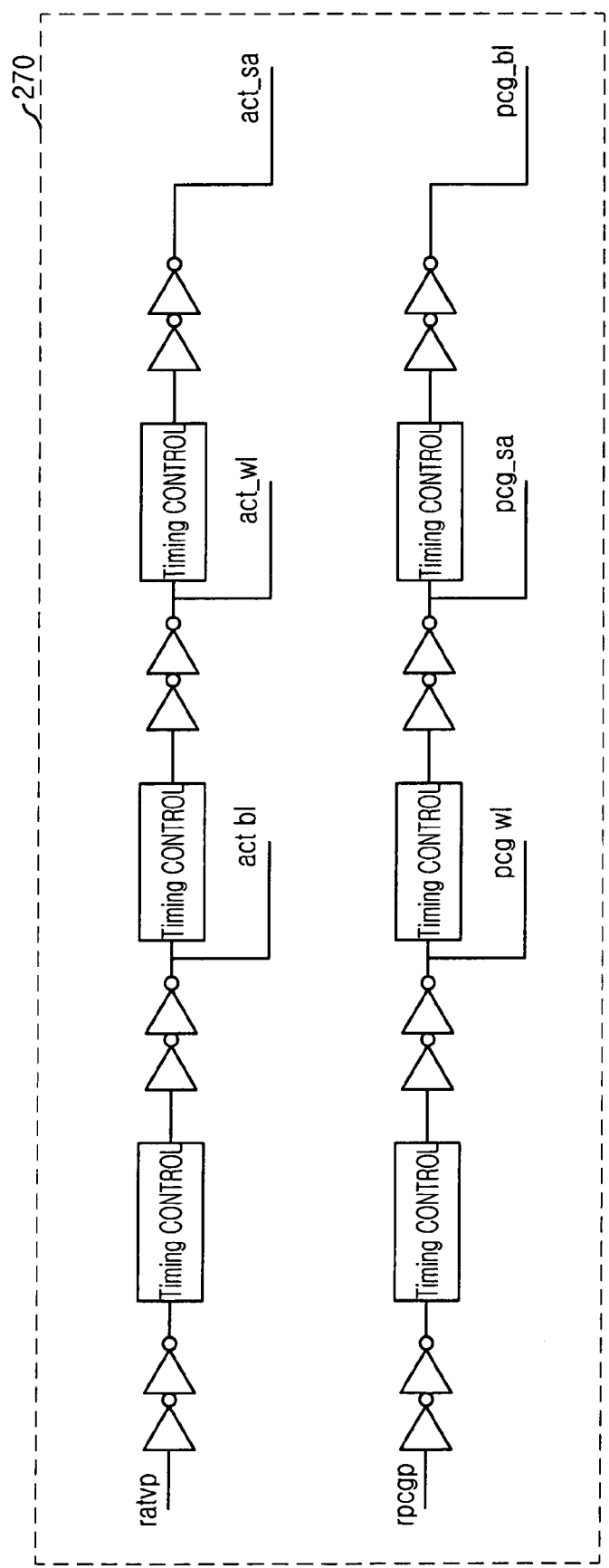
FIG. 4B is a block diagram of a timing controller in the X path controller shown in FIG. 3.
Figure 4C:
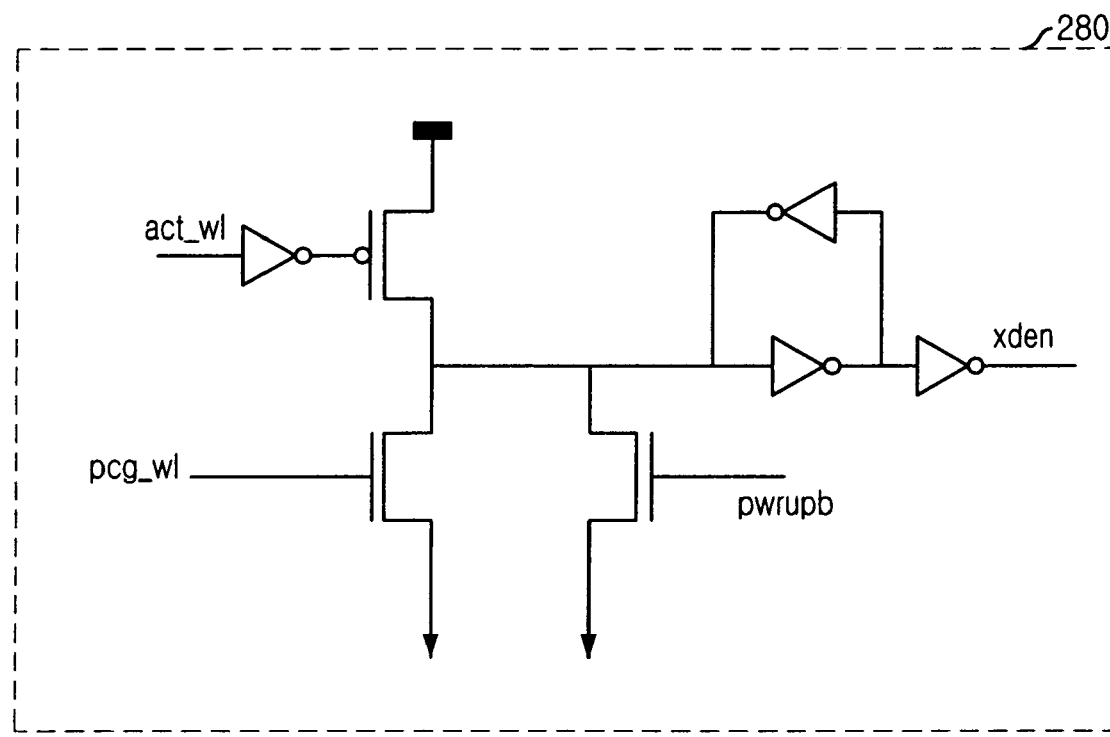
FIG. 4C is a schematic diagram of an X decoder interrupter in the X path controller shown in FIG. 3.
Figure 4D:
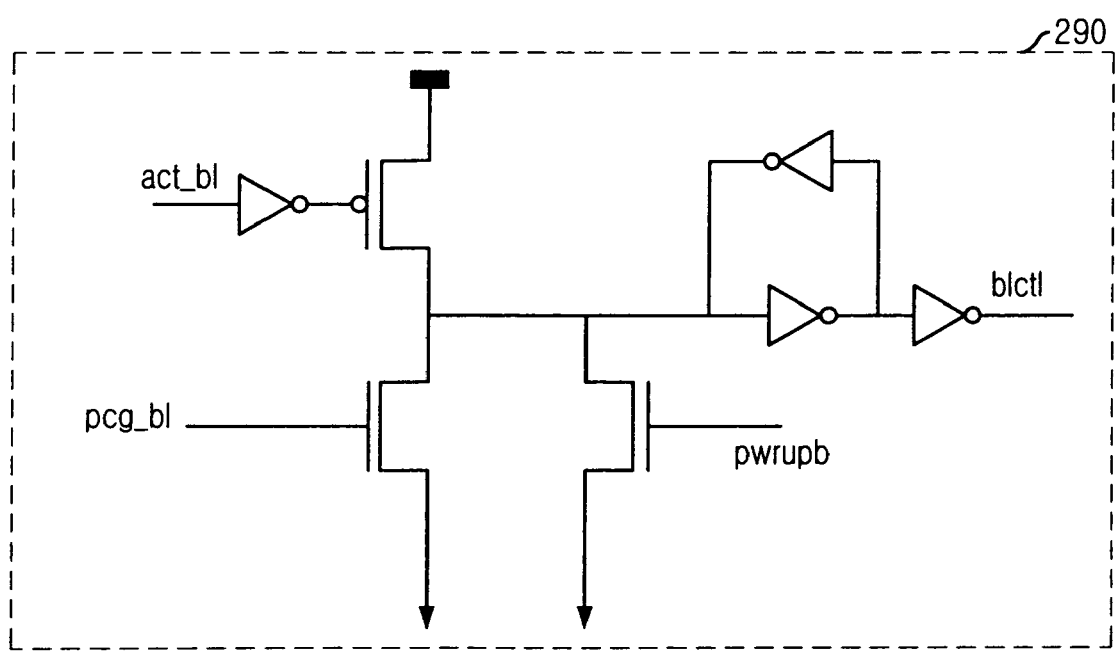
FIG. 4D is a schematic diagram of a block control signal generator in the X path controller shown in FIG. 3.

The structures of timing controller 270, X decoder interrupter 280, and bit line controller 290 are the same as those of the exemplary embodiment shown in FIGS. 4B to 4D.

Figure 11:
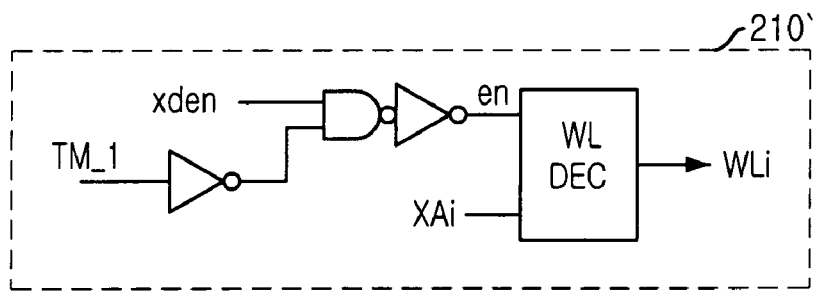
FIG. 11 is a block diagram of an X decoder of the exemplary semiconductor memory device.

FIG. 11 is the block diagram showing an X decoder of the semiconductor memory device. The structure of X decoder 210' is similar to that of the prior art except that X decoder enable signal xden for activating X decoder 210' is not inputted directly, but by way of an input controller 212'. In the first test mode, input controller 212' cuts off an input of X decoder enable signal xden, thereby inactivating X decoder 210'.

Figure 12:
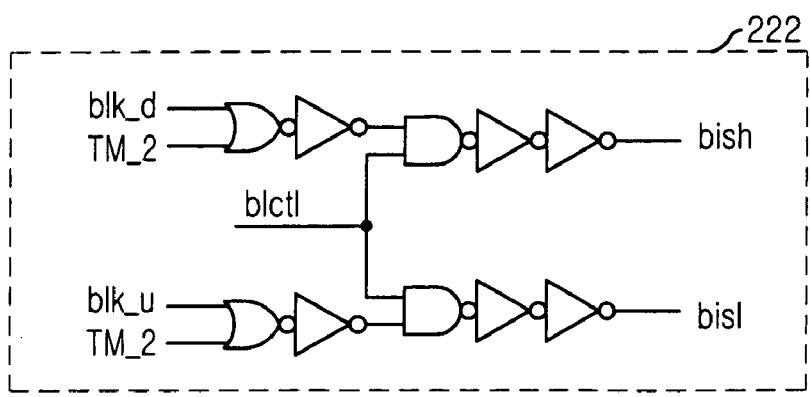
FIG. 12 is a schematic circuit diagram of a bit line selection controller included in the BLSA controller constituting the exemplary semiconductor memory device.

FIG. 12 is a schematic circuit diagram showing a bit line selection controller included in the BLSA controller of the semiconductor memory device. The bit line selection switch controller 222 allows all the upper and lower bit line switches to be turned on by inputting a bit line control signal blctl of logic low at a precharge state on the bit line. In the second test mode, controller 222 always turns off all the upper and the lower bit line switches when there is no bit line precharge.

FIG. 13 is a timing diagram of an operation run when testing the offset voltage of the sense amp of the semiconductor memory device in a zero test mode, in accordance with the second exemplary embodiment of the invention. Operation of this embodiment of the invention in zero test mode is now described in detail with reference to the signals shown in FIG. 13.

When running a test in the zero test mode of the illustrative semiconductor memory device, the test conducting instruction TM_F and test mode signal TM_0 are provided. The test mode is then carried out by X path interrupter 250, external voltage supply instruction generator 140, and write driver controller 180, which are driven or stopped based on test conducting instruction TM_F. In an offset voltage test in the semiconductor memory device of the second exemplary embodiment, a series of operations are preferably conducted in accordance with the external active instruction (specifically, analysis of external control signals) as in the case of a general operation. In the case of an active instruction, if the command decoder (not shown) generates a low active pulse rate, then external voltage supply instruction LIO_force is activated by a logic high state "H"; bit line equalization signal bleq is inactivated by a logic low state "L"; and a word line signal WLi is given such that the memory cell to be tested is selected based on X address (step S120). In a shared sense amp structure, bit line selection signal bish/bisl is sent to select one of two bit line equalization switches in step S120.

The external test voltage is applied to first and second external voltage supply pads 162 and 164 according to external voltage supply instruction LIO_force. Then a voltage difference the same size as the external voltage is fed to the bit line and inversion bit line that were equalized with precharge voltage after performing step S120.

On testing the offset voltage with the invention, the offset voltage is measured by writing the test voltage on the memory cell being tested. The write instruction is preferably used as in a general process; and the command decoder generates a write cas pulse casp_wd to represent the write instruction. Disable trigger 142 (FIG. 5) inputting write cas pulse casp_wd delays the external voltage supply instruction by a certain interval so that the instruction is inactivated.

Signal Yi, which is address Y for selecting the sense amp and pair of bit lines that are coupled to a pair of local input/output lines carrying the test voltage, may be activated during a period corresponding to the activation period of external voltage supply instruction LIO_force. Alternatively, Yi may be activated during a delay interval that corresponds to write cas pulse casp_wd. Otherwise, Yi may be implemented by specifying address Y to the sense amplifier to be tested. Further, using the Y decoder controller described in FIG. 8, the signal may be implemented by applying the test voltage to all sense amps coupled to the pair of local input/output lines for testing.

If the test voltage is fully applied to the memory cell to be tested, the application of test voltage stops and the sense amp is activated, thereby reading detected data. This process inactivates external voltage supply instruction LIO_force inactivated by a logic low state "L", stopping the supply of external voltage to the pair of local input/output lines (step S140).

If the enable instruction In_ext is externally input at a state when external voltage supply instruction LIO_force is at logic low state "L", sense amp interrupter 260' of FIG. 10 activates sense amp enable signal seen by a logic high state "H", thereby activating the sense amp (step S160). Thereafter, at step S180, a value that is amplified by the sense amp is read using a read path in the memory device. Accordingly, even when reading value is detected in the test mode, the command decoder outputs a read cas pulse casp_rd, as in a general read process, activating signal Yi and turning on its corresponding switch. When applying the test voltage, several sense amps (bit lines) are connected to one pair of local input/output lines, but when reading the value detected by the test, only one sense amp (bit line) is connected to one pair of local input/output lines.

In the read operation of step S180, if the externally applied test voltage difference is larger than the offset voltage of the sense amp, the digital value of the applied test voltage is read. Conversely, if the externally applied test voltage difference is less than the offset voltage of the sense amp, the sense amp fails to conduct the read operation by proceeding to a precharge (reset) state. The offset voltage for measurement in the exemplary embodiment of the invention issues from the memory cell selected by word line signal WLi, and from the bit line and the sense amp.

When the read operation in step S180 has been completed, sense amp enable signal seen, word line signal WLi, etc. are disabled by a precharge pulse outputted by the command decoder, which establishes the current time as the precharge time. Then a pair of local input/output lines is precharged at a state in which the upper and lower bit line selection switches are turned on.

Figure 14:
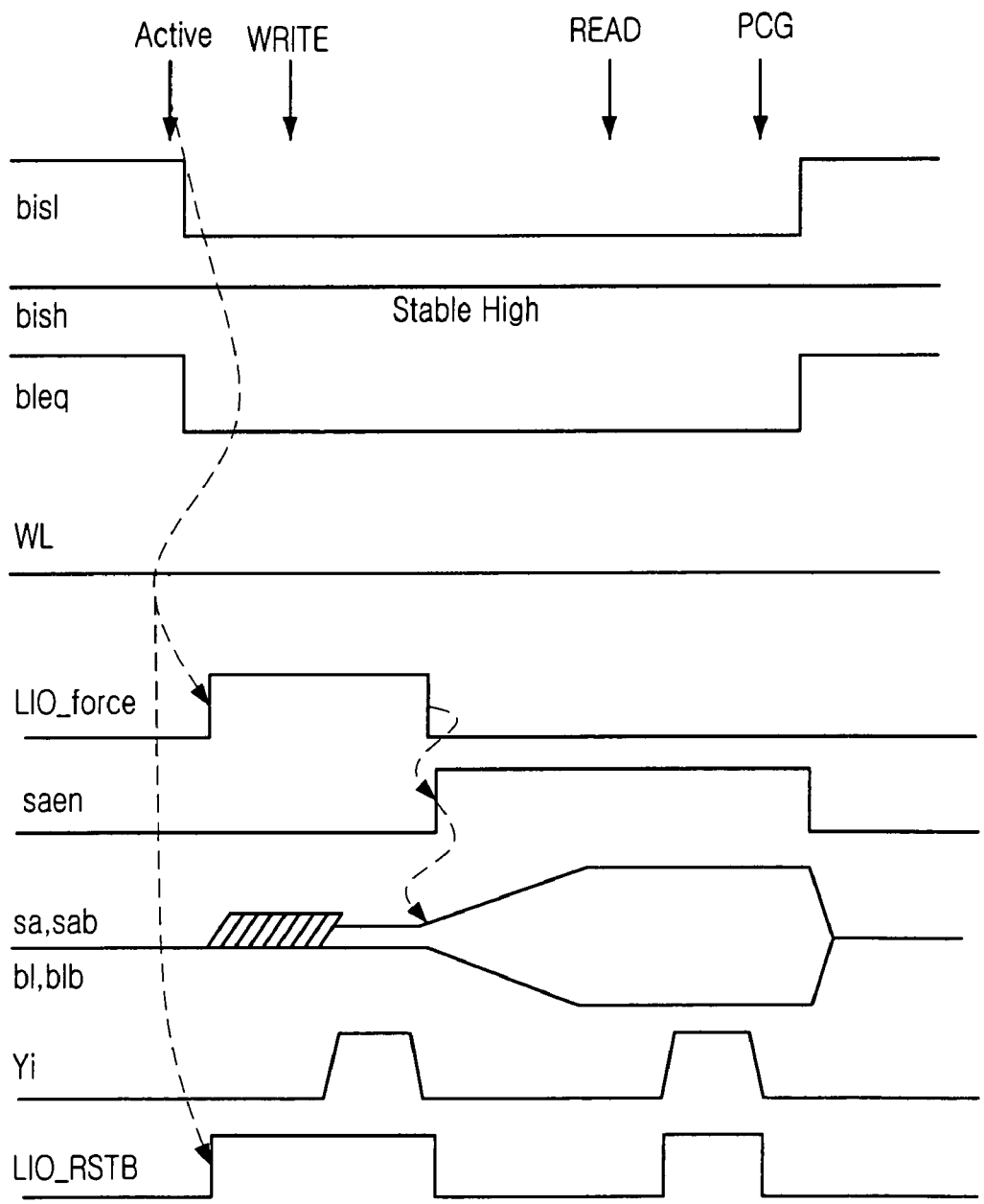
FIG. 14 is a timing diagram of an operation performed when testing the offset voltage of the sense amp in a first test mode of the exemplary semiconductor memory device.

FIG. 14 depicts a timing diagram of each signal when conducting the first test mode with respect to the semiconductor memory device in accordance with the second exemplary embodiment of the invention. Hereinafter, operation of the second exemplary embodiment of the invention in the first test mode is described in detail with reference to the signals shown in FIG. 14.

First, test conducting instruction TM_F and test mode signal TM_0 activated in the test mode decider are outputted. Using these signals, the test mode is carried out by X path interrupter 250, external voltage supply instruction generator 140, and write driver controller 180, which are driven or stopped based on the test conducting instruction. According to the active instruction, if a low active pulse rate is generated by a command decoder (not shown), then external voltage supply instruction LIO_force is activated by a logic high state "H", and bit line equalization signal bleq is inactivated by a logic low state "L" (step S120). In the shared sense amp structure, a bit line selection signal bish/bisl is sent to select one of two bit line equalization switches in step 120. X decoder 210' (FIG. 9) is inactivated in step S120 since the enable signal en is inactivated by a logic low state "L" if the first test mode signal TM_1 is applied thereto.

Due to the external test voltage applied through first and second external voltage supply pads 162 and 164 according to external voltage supply instruction LIO_force, a voltage difference of the same size as the external voltage is fed to the bit line and inversion bit line that have been equalized with a precharge voltage, after performing step S120.

The first test mode is performed only at a state when no memory cell is coupled to a pair of bit lines connected to the sense amp. Thus, the write operation process is not required; but using write cas pulse casp_wt, as in other modes, to correspond to the timing is desirable.

Disable trigger 142 of FIG. 3 inputs write cas pulse casp_wd to inactivate external voltage supply instruction LIO_force by allotting a certain delay time thereto.

The signal Yi which is address Y for selecting the sense amp and pair of bit lines that are coupled to the pair of local input/output lines carrying the test voltage, may be activated during a period corresponding to the activation period of external voltage supply instruction LIO_force. Alternatively, the signal may be activated during a certain delay time corresponding to the write cas pulse casp_wd instruction. Otherwise, when running the test, Yi may be executed by specifying address Y to the sense amp to be tested. Using the Y decoder controller of FIG. 8, Yi may also be implemented by applying the test voltage to all sense amps coupled to the pair of local input/output lines for testing.

After a certain delay interval from the activation time of write cas pulse casp_wd, external voltage supply instruction LIO_force is inactivated by a logic low state "L", and the supply of external voltage to the pair of local input/output lines stops (step S140). Then, sense amp enable signal seen is activated in step S160. Inactivation of the zero test mode signal TM_0 and of external voltage supply instruction LIO_force (FIG. 14), activates sense amp enable signal seen. If the TM_0 signal is activated, sense amp enable signal seen is activated according to a separate external instruction, as shown in FIG. 13.

Thereafter, a process (step S180) of reading the value amplified by the sense amp employs the procedure of reading data using a read path in the memory device. Then the command decoder outputs a read cas pulse casp_rd, as in a general read process, activating signal Yi and turning on the corresponding Yi switch.

In step S180, the read operation is conducted such that if the external test voltage difference is larger than the offset voltage of the sense amp, the digital value of the applied test voltage is read. Conversely, if the external test voltage difference is smaller than the offset voltage of the sense amp, the sense amp fails to conduct the read operation by proceeding to a precharge (reset) state. The offset voltage in the test mode of the exemplary embodiment of the invention issues from the sense amp and one pair of bit lines coupled thereto.

When the read operation of step S180 has been completed, sense amp enable signal seen is disabled by a precharge pulse outputted by the command decoder, which has selected the current time as the precharge time. Then the precharge process of bit lines and/or the pair of input/output lines is conducted at a state in which the upper and the lower bit line selection switches are turned on.

Figure 15:
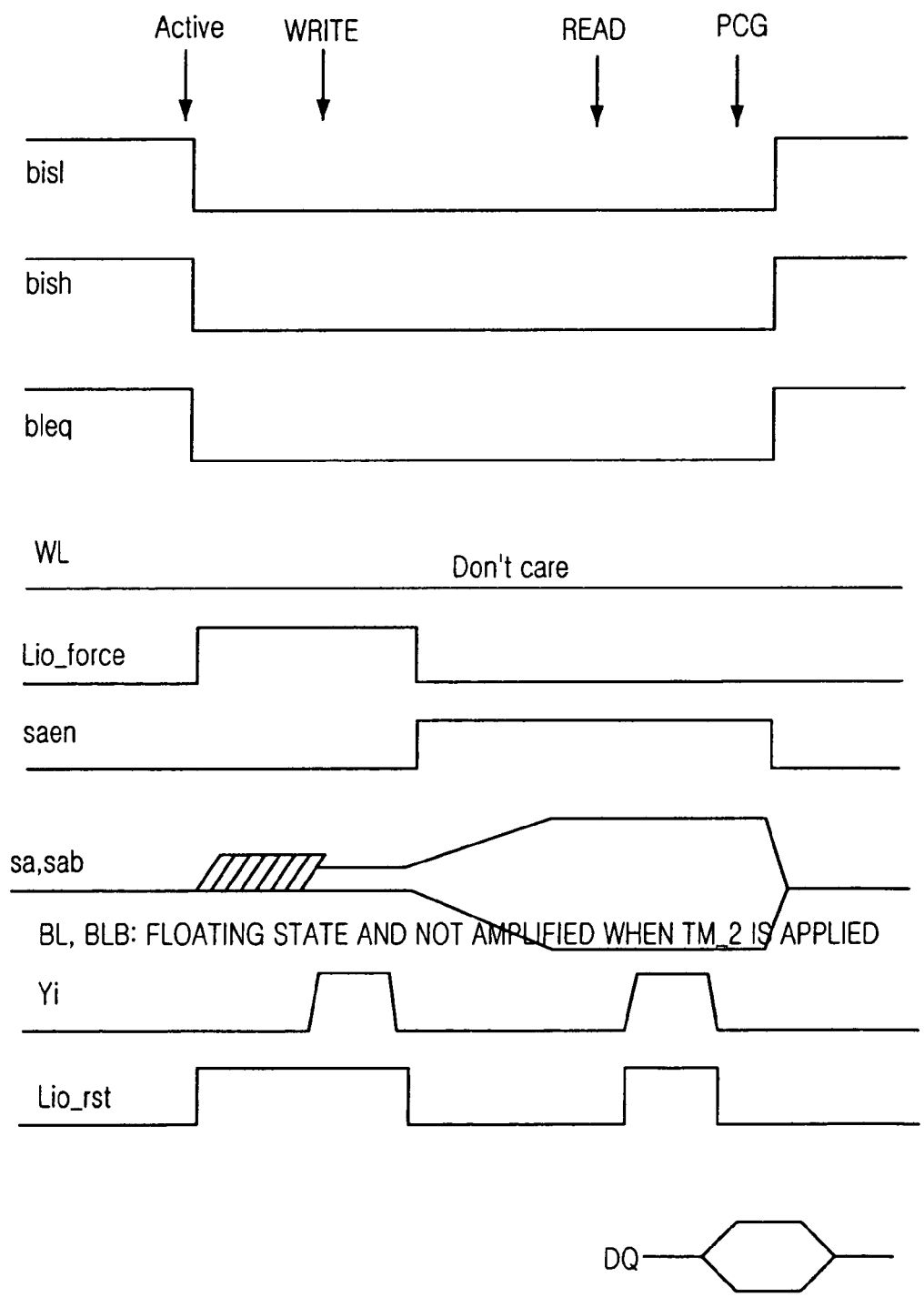
FIG. 15 is a timing diagram of an operation performed when testing the offset voltage of the sense amp in a second test mode of the exemplary semiconductor memory device.

FIG. 15 illustrates a timing diagram of each signal when conducting the second test mode with respect to the semiconductor memory device in accordance with the second exemplary embodiment of the present invention. Operation of the second embodiment of the present invention in the second test mode is now described in detail with reference to the signals shown in FIG. 15.

When conducting the test in the second test mode of the semiconductor memory device, first, test conducting instruction TM_F and test mode signal TM_0, activated by the test mode decider, are outputted. Using these signals, the test mode is carried out by X path interrupter 250, external voltage supply instruction generator 140, and write driver controller 180 which are driven or stopped based on test conducting instruction TM_F. According to the active instruction, if a low active pulse rate is generated by the command decoder (not shown), external voltage supply instruction LIO_force is activated by a logic high state "H", and bit line equalization signal bleq is inactivated by a logic low state "L" (step S120). In this test mode, at step S120, all the two-bit line equalization switches are turned off, thereby the bit line is disconnected from the sense amp to be tested.

Due to the external test voltage applied through first and second external voltage supply pads 162 and 164 according to the external voltage supply instruction LIO_force, a voltage difference of the same size as the external voltage is fed to the bit line and inversion bit line that have been equalized with precharge voltage, after performing step S120.

The second test mode does not require the write operation; but using the write cas pulse casp_wt, as in other modes, to harmonize with timing.

Disable trigger 142 of FIG. 3 inputs write cas pulse casp_wd that inactivates external voltage supply instruction LIO_force by allotting a certain delay time thereto.

The signal Yi, which is address Y for selecting the sense amp and pair of bit lines that are coupled to pair of local input/output lines carrying the test voltage, may be activated during a period corresponding to the activation period of external voltage supply instruction LIO_force. Alternatively, the signal may be activated during a certain delay time corresponding to the write cas pulse casp_wd. Otherwise, when running the test, Yi may be implemented by specifying address Y to the sense amp to be tested. Yi also it may be implemented by applying the test voltage to all sense amps coupled to the pair of local input/output lines for testing, using the Y decoder controller of FIG. 8.

After a certain delay time from the activation time of write cas pulse casp_wd, the inactivated external voltage supply instruction LIO_force goes to a logic low state "L", thereby stopping the supply of external voltage to the pair of local input/output lines (step S140). Then, sense amp enable signal seen is activated in step S160. Whether or not an external instruction is used is determined by the logic state of the TM_0 signal.

A read operation (step S180) follows in which the sense amplifier reads the amplified value by using a read path in the memory device. When the test is conducted, the command decoder, even when reading detected data, outputs a read cas pulse casp_rd, as in a general read process, activates signal Yi, and turns on the corresponding Yi switch.

Read operation in step S180, if the applied external test voltage difference is larger than the offset voltage of the sense amp, the digital value of the applied test voltage is read out. Otherwise, if the applied external test voltage difference is smaller than the offset voltage of the sense amp, the sense amp fails to conduct the read operation by proceeding to a precharge (reset) state. The offset voltage in this exemplary embodiment of the invention is the sense amp and one pair of bit lines coupled thereto.

When the read operation of step S180 has been completed, the sense amp enable signal seen is disabled by a precharge pulse outputted by the command decoder that establishes the current time as the precharge time. Then the precharge process for the bit lines and/or the pair of input/output lines is conducted at a state where the upper and lower bit line selection switches are turned on.

As a result, with the exemplary semiconductor memory device of the invention, the offset voltage of the bit line sense amp can be precisely measured precisely by deciding whether to generate amplification by applying a test voltage directly to the bit line sense amp, instead of using an estimated value obtained by calculation.

Moreover, the invention allows bit line or input/output lines to be disconnected on application of test voltage, thereby measuring offset voltage in various situations, and also measuring the offset voltage of only a bit line sense amp.

The present application contains subject matter related to the Korean patent application No. 2004-87670, filed in the Korean Patent Office on Oct. 30, 2004, the entire contents of which are incorporated herein by reference.

While the present invention has been described with respect to the particular embodiments, it will be apparent to those skilled in the art that various changes and modifications maybe made without departing from the spirit and scope of the invention as defined in the following claims.

What is claimed is:

1. A semiconductor memory device for measuring an offset voltage of a sense amplifier comprising:
    a bit line sense configured to amplify a voltage difference between a bit line and an inversion bit line, for carrying data stored in a memory cell in response to inputted command and address;
    a data input/output line and an inversion data input/output line respectively coupled to a bit line and an inversion bit line by one or more switches;
    an external voltage supply controller configured to transmit test voltages into the data input/output line and the inversion data input/output line in response to a test control signal; and
    an external voltage supply instruction generator configured to produce the test control signal based on a plurality of input signals.

2. The semiconductor memory device as recited in claim 1, wherein the test voltages are respectively inputted externally through a plurality of external voltage supply pads to the semiconductor memory device.

3. The semiconductor memory device as recited in claim 2, wherein the external voltage supply controller includes:
a first switch configured to connect and disconnect the data input/output line to a first external voltage supply pad based on the test control signal; and
a second switch configured to connect or disconnect the inversion data input/output line to a second external voltage supply pad based on the test control signal.

4. The semiconductor memory device as recited in claim 3, wherein the first and the second switches are mono transistors.

5. The semiconductor memory device as recited in claim 3, wherein first and second external voltage supply pads are distinct from pads for external port connection for input and output of data, instruction, and/or addresses by a general memory chip.

6. The semiconductor memory device as recited in claim 5, wherein the external voltage supply instruction generator includes:
an enable trigger configured to enable the test control signal based on a low active pulse and a test mode signal generated in the semiconductor memory device;
a disable trigger configured to disable the test control signal based on a write cas signal generated in the semiconductor memory device; and
a timing controller configured to adjust an output timing of the test control signal.

7. The semiconductor memory device as recited in claim 6, wherein the timing controller includes a falling edge delay configured to delay a falling edge of the test control signal by a preset time period.

8. The semiconductor memory device as recited in claim 1, further comprising a test mode setter configured to output a test conduction instruction for conducting a test of the offset voltage.

9. The semiconductor memory device as recited in claim 8, wherein the test mode setter is configured to output the test conduction instruction and a plurality test mode signals to change a method to test the offset voltage.

10. The semiconductor memory device as recited in claim 1, further comprising a write driver configured to provide a voltage in a ferry region as a voltage difference between the data input/output line and the inversion data input/output line, wherein the write driver is inactivated when the offset voltage test is conducted.

11. The semiconductor memory device as recited in claim 1, further comprising a write driver controller configured to input a write cas signal that is supplied in the semiconductor memory device to output a write drive enable signal, wherein the write driver enable signal is disabled when the offset voltage test is performed.

12. The semiconductor memory device as recited in claim 1, further comprising a sense amplifier configured to control inactivation of a sense amplifier enable signal, which is a drive control signal, for the sense amplifier if the external voltage supply controller performs a connection operation.

13. The semiconductor memory device as recited in claim 1, further comprising a sense amplifier controller for producing a sense amplifier enable signal, which is a drive control signal, for the sense amplifier by a separate external input signal if the offset voltage is tested.

14. The semiconductor memory device as recited in claim 1, further comprising an X decoder, wherein if the X decoder is activated a memory cell is selected to be accessed and inactivated if the offset voltage is tested.

15. The semiconductor memory device as recited in claim 1, further comprising:
an upper bit line selection switch configured to connect an upper bit line, which is coupled to a first plurality of memory cells, to the bit line sense amplifier;
a lower bit line selection switch configured to connect a lower bit line, which is coupled to a second plurality of memory cells, to the bit line sense amplifier; and
a bit line selection switch controller configured to cut off the upper and lower bit line selection switches if the offset voltage test is performed.

16. A method of measuring an offset voltage of a sense amplifier, the method comprising the steps of:
(a) applying an externally generated test voltage from a contact pad to a data input/output line in a core region, including:
generating an equalization signal to deactivate the data input/output line, and
selecting a memory cell to be tested from a plurality of memory cells coupled to a sense amplifier to be tested;
(b) stopping the application of the test voltage;
(c) activating the sense amplifier; and
(d) reading data amplified by the sense amplifier via a read path of a memory device.

17. The method as recited in claim 16, further comprising, after the step (a), connecting the sense amplifier to be tested to the data input/output line.

18. The method as recited in claim 17, wherein the step (b) includes:
(b1) disconnecting the sense amplifier from the data input/output line, wherein, thereafter
(b2) applying a precharge to the data input/output line, and after the step (c),
(c1) connecting the sense amplifier to the data input/output line.

19. The method as recited in claim 18, wherein the step (a) is performed in based on an externally applied activation instruction, and the step (d) is performed based on an externally applied read instruction.

20. The method as recited in claim 18, wherein the step (c) is performed based on an externally applied instruction.

21. The method as recited in claim 18, wherein the step (a) further includes
(a1) selecting one bit line, to which the memory cell to be tested is coupled, from the of bit lines connected to the sense amplifier.

22. A method of measuring an offset voltage of a sense amplifier, the method comprising the steps of:
(a) applying a externally generated test voltage from a contact pad to a data input/output line in a core region, including:
generating equalization signal to deactivate the data input/output line, and
deselecting all memory cells coupled to a sense amplifier to be tested;
(b) stopping the application of the test voltage;
(c) activating the sense amplifier; and
(d) reading data amplified by the sense amplifier via a read path of a memory device.

23. The method as recited in claim 22, further comprising, after the step (a),
(a1) connecting the sense amplifier to be tested to the data input/output line.

24. The method as recited in claim 23, wherein: the step (b) includes:
- (b1) disconnecting the sense amplifier from the data input/output line, wherein, thereafter
- (b2) applying a precharge for the data input/output line; and after the step (c), (c1) connecting the sense amplifier to be tested to the data input/output line.

25. The method as recited in claim 24, wherein the step (a) is performed in based on an externally applied activation instruction, and the step (d) is performed based on an externally applied read instruction.

26. The method as recited in claim 24, wherein the step (c) is performed based on an externally applied instruction.

27. The method as recited in claim 24, wherein the step (a) further includes
- (a1) selecting one bit line, to which the memory cell to be tested is coupled, from the of bit lines connected to the sense amplifier.

28. The method as recited in claim 24, wherein the step (a) includes:
- (a3) deselecting the bit lines connected to the sense amplifier to be tested.

* * * * *